United States Patent [19]

Brenner et al.

[11] Patent Number: 5,348,150
[45] Date of Patent: Sep. 20, 1994

[54] COMPARTMENTALIZED CARRIER FOR INTEGRATED CIRCUITS

[76] Inventors: Joseph H. Brenner, P.O. Box 66868, Scotts Valley, Calif. 95067; Suhail Katrib, 5087 Elester Dr., San Jose, Calif. 95124

[21] Appl. No.: 35,632

[22] Filed: Mar. 23, 1993

[51] Int. Cl.⁵ .................................. B65D 73/02
[52] U.S. Cl. ................... 206/328; 206/332; 206/334
[58] Field of Search .............. 206/328, 332, 334; 361/212, 220; 53/410, 445, 474

[56] References Cited

U.S. PATENT DOCUMENTS

| | | | |
|---|---|---|---|
| 3,650,430 | 3/1972 | Siegmar et al. | 206/332 |
| 4,327,832 | 5/1982 | de Matteo | 206/328 |
| 4,565,288 | 1/1986 | Walther | 361/220 |
| 4,598,820 | 7/1986 | Murphy | 206/334 |
| 4,711,350 | 12/1987 | Yen | 206/328 |
| 4,712,675 | 12/1987 | Scholten | 206/332 |
| 4,712,679 | 12/1987 | Lowe | 206/387 |
| 4,733,778 | 3/1988 | Boeckmann | 206/332 |
| 4,899,876 | 2/1990 | Murph et al. | 206/334 |
| 4,903,380 | 2/1990 | Kirby | 206/334 |
| 4,906,162 | 3/1990 | Long et al. | 53/410 |
| 4,944,651 | 7/1990 | Bogar | 206/334 |
| 5,012,925 | 5/1991 | Gallagher, Sr. | 206/334 |
| 5,234,104 | 8/1993 | Schulte et al. | 206/332 |
| 5,242,051 | 9/1993 | Murphy | 206/334 |

FOREIGN PATENT DOCUMENTS 6484881 3/1989 Japan .................. 206/328

Primary Examiner—David T. Fidei
Attorney, Agent, or Firm—Robert Samuel Smith

[57] ABSTRACT

A carrier for transporting delicate devices (articles) expecially integrated circuits comprising a tube with a row of openings in its wall and separators attached to an elongated member wherein each separator fits into one of the openings thereby separating the interior of the tube into a row of spaces such that a device is positioned in each space and maintained out of contact with other devices. The separator may have one of several forms including a short wall or a stub. In one embodiment, the elongated member is a channel that straddles the tube in one position where the separators are inserted into the interior of the tube and in another position where the separators are withdrawn from the interior of the tube.

15 Claims, 3 Drawing Sheets

COMPARTMENTALIZED CARRIER FOR INTEGRATED CIRCUITS

BACKGROUND

1. Field of the Invention

This invention relates to shipping containers for integrated circuit devices and especially toward a carrier that has removable barriers, each barrier maintaining protective separation between the individual devices.

2. Relevant Art and Information Disclosure

Prior integrated circuit devices comprise a rectangular plastic, ceramic or aluminum block about the size of a postage stamp and a number of leads extending along a pair of opposite edges of the block. Wide spread practice has been to transport these devices in plastic tubes (carriers). having a generally cross sectional shape similar to the letter "A" such that a number of these devices are insertable into the tube with the leads straddling a central internal ridge.

Various modifications to the "A" frame carrier have been introduced over the years to resolve certain problems associated with shipping the device. One of the major problems with shipping devices in "A" frame carriers was that the leads rubbing against the central ridge would generate static electricity that would damage the device.

An early approach to resolving this problem was to coat the tube with an electrically conductive carbon based coating. However, this practice prevented the user from inspecting identifying indicia on the IC surface. U.S. Pat. No. 4,327,832 to de Matteo discloses an elongated window on the top surface of the "A" frame that permits the viewer to inspect the indicia of Integrated circuits devices stored in the tube.

Another approach to resolving this problem is disclosed in U.S. Pat. No. 4,711,350 to Yen for an "A" frame having a pair of indents extruded in the shoulder of the cross sectional profile of the tube which prevents the leads of the older style IC device from rubbing against the central ridge.

U.S. Pat. No. 4,733,778 to Boeckmann et al and 4,712,675 to Scholten et al disclose carriers of the type wherein pockets holding devices are molded into an elongated member. This approach does not provide the convenience of being able to feed serially the devices one at a time out of the end of the elongated member.

U.S. Pat. No. 4,712,679 to Lowe discloses a package for disks having removable separators wherein separators are removable one at a time and require that the package must be opened in order to gain access to the disks.

A more recently developed IC device is one in which the device is square and a larger number of leads are provided which are mounted on all four edges of the device. Additionally, the method of mounting the devices has changed with the advent of surface mount technology. In order to attach integrated circuits with a large number of leads to a flat mounting surface, "J" shaped leads are used which must be coplanar in order that all leads touch the surface simultaneously. These devices are also currently shipped in extruded plastic tube carriers. The problem with shipping the devices in these carriers is that the leads of neighboring devices come into contact with one another which results in bending the leads so that they are no longer coplanar. This results in rejection of otherwise good devices or the requirement to manually straighten the leads in an effort to reestablish coplanarity.

THE INVENTION

OBJECTS

It is an object of this invention to provide a carrier for integrated circuit devices of the type having leads along all four edges of a central square block.

It is another object that the devices in the carrier be maintained separate from one another so as not to entangle the leads of neighboing devices.

It is another object that, when the carrier is not completely filled with devices, the devices will not slide randomly back and forth in the carrier thereby causing damage to the devices or leads.

It is another object to enable the devices to slide into and out of the carrier.

SUMMARY

This invention is directed toward an elongated tubular carrier especially for transporting integrated circuit devices of the recent type wherein the tube is provided with mechanical separators between neighboring devices to prevent them from coming in contact with one another while in the carrier tube.

The separators are removable in order to permit the devices to slide smoothly into and out of the tube. It is furthermore a feature of the invention to be able to remove all the separators simultaneously in order to speed the removal or insertion of the devices from or into the tube. To accomplish this object, the "snapwall" concept of this invention provides a row of barriers on an elongated support.

The support may be any one of a number of elongated profiles which are embodiments of the invention.

In one embodiment, the barriers are mounted on a "U" channel wall support. A series of slots in the upper surface of the tube allows the walls to be inserted between the devices to separate them or allows the walls to be retracted in order to allow the devices to slide out of the tube. The wall separator assembly is never completely separated thereby adding great convenience to handling the carrier.

In another embodiment, the devices are simply stubs that are linearly arranged along a strip.

Holes are also arranged along the tube and spaced to allow each one of the stubs to fit into one hole respectively.

DRAWINGS

Figure 3A:
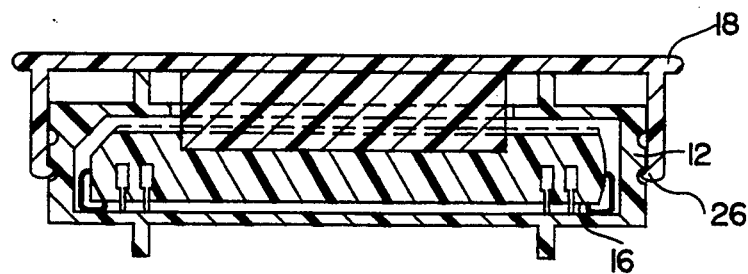

FIG. 3 A is a sectional view showing the walls in position to maintain the devices out of contact with one another.

Figure 3B:
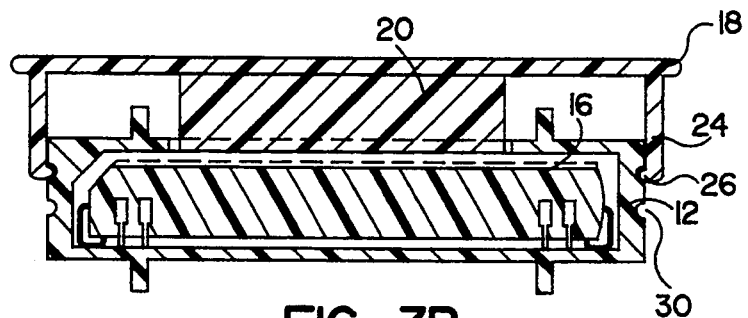

FIG. 3B is a sectional view showing the wall in position to permit removal of the devices from the tube.

Figure 4:
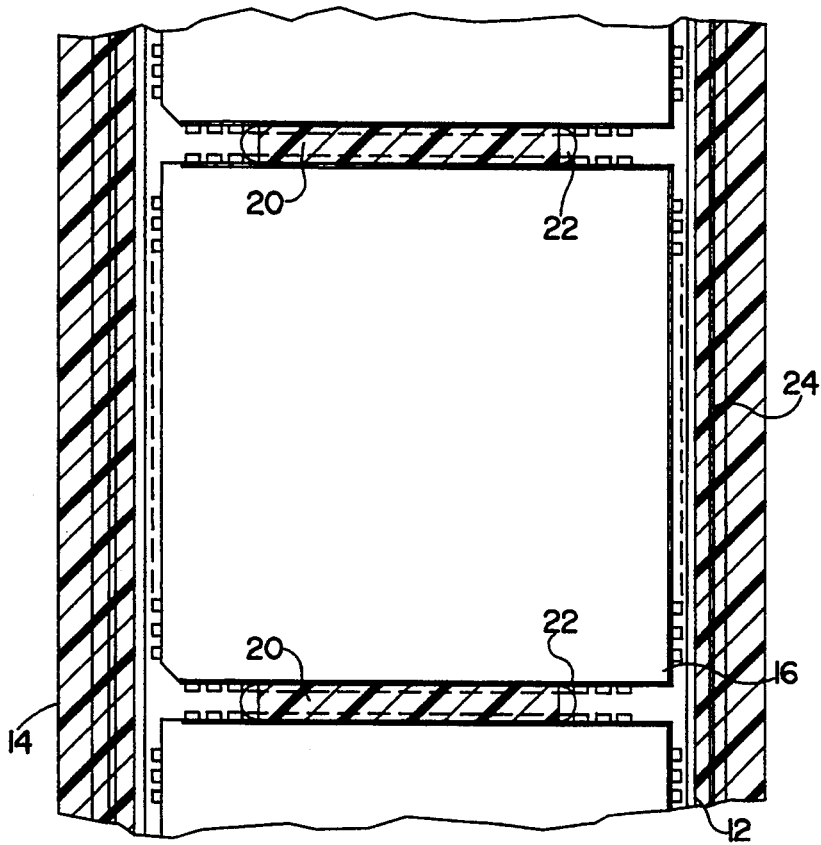

FIG. 4 is a sectional top view.

Figure 5A:
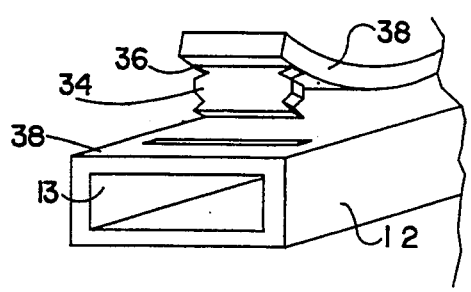

FIG. 5A is a perspective view showing the invention with a strip retainer.

Figure 5B:
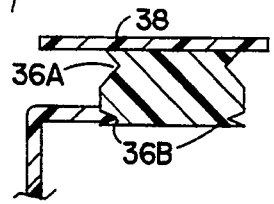

FIG. 5B is a sectional view showing a view of the wall with retaining notches.

Figure 6:
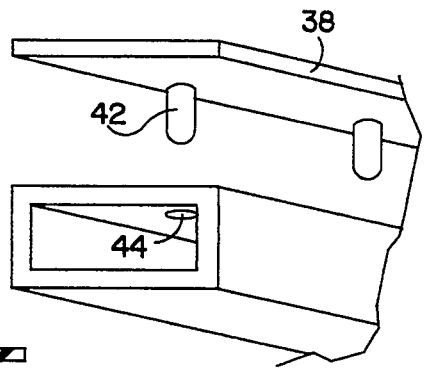

FIG. 6 is a perspective view shows the invention with stub separators.

Figure 7:
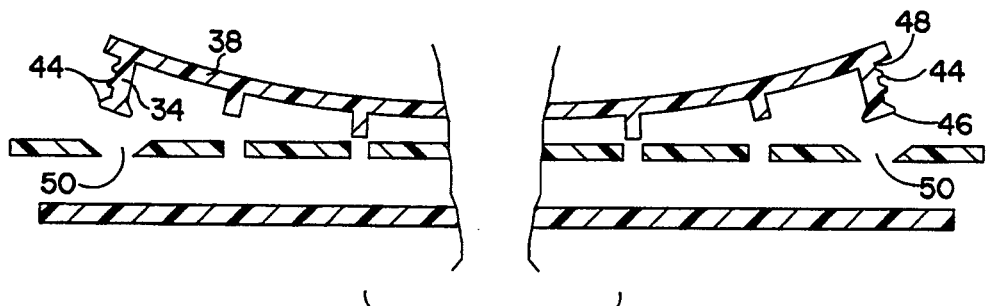

FIG. 7 is a sectional view showing stub retainers with flared ends.

Figure 8:
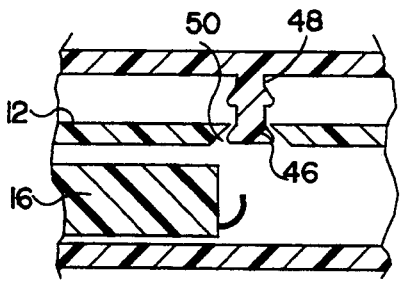

FIG. 8 shows stub retainers or separators having flared ends in the tube open position.

Figure 9:
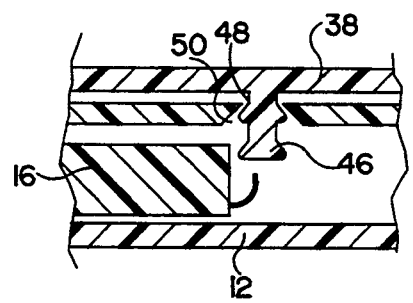

FIG. 9 shows stub retainers or separators having flared ends in the tube closed position.

Figure 10:
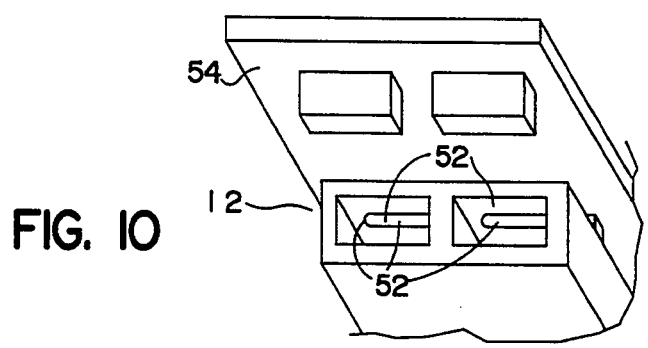

FIG. 10 shows a two compartment tube.

DESCRIPTION OF PREFERRED MODES

The following discussion presents variations and modifications of the invention including what I presently believe to be the best mode for carrying out the invention.

Figure 1:
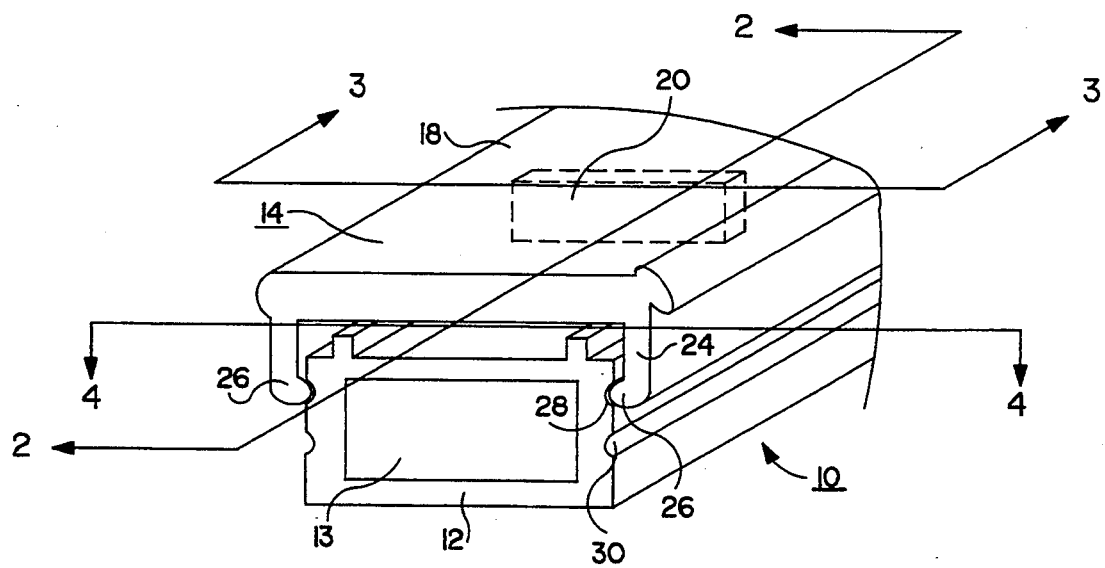
FIG. 1 is a perspective view showing tile invention with a channel retainer.
Figure 2:
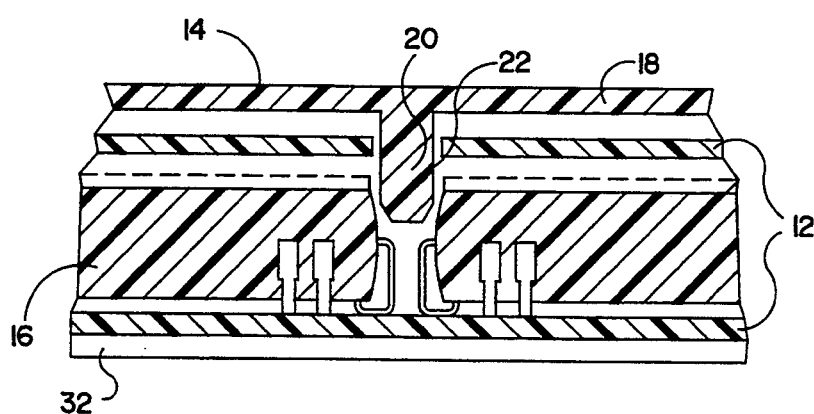
FIG. 2 is a sectional view in side elevation.

Turning now to a discussion of the drawings, FIG. 1 shows in perspective a cutaway length of one embodiment of the carrier 10 of this invention. FIGS. 2, 3A 3B and 4 are cross sectional views of FIG. 1 taken along lines of sight 2, 3 and 4 as indicated in FIG. 1. The carrier includes a tube 12 having a generally rectangular cross sectional opening 13 into which a number of devices 16 may slide. The carrier also includes a second elongated retainer member generally indicated as 14 having a generally channel cross section which straddles the tube 12. The channel retainer member 14 has a plurality of parallel walls 20 spaced from one another in the long dimension of the channel. Each wall 20 is perpendicular to the long dimension. Each wall 20 is spaced to slide into a slotted opening 22 respectively in the top surface of the tube 12. A catch 26 is formed on each end of the side legs 24 of the channel member 18 which snap engage with grooves 28 in the outside of the side walls of the tube 12 and thereby retain the walls 20 in a retracted position, i.e., withdrawn from the inside of tube 12. This position of the walls 20 (shown in FIG. 3B) permits sliding the devices 16 out of the open end of the tube 12. When the catches 26 are snapped into the lower grooves 30, each wall 20 is lowered into positions between neighboring devices 16 thereby maintaining the leads out of contact with the leads of the neighboring device 16.

Other embodiments that incorporate principles of the invention are illustrated in FIG. 5–7.

FIG. 5A shows the tube 12 for transporting the devices and separator walls 34 (only one is shown in FIG. 5A) which fit down into slots 22 in the top of the tube 12. The walls 34 are arranged in a row, parallel to one another and secured to a moderately flexible strip 38. Each wall 34 has at least one notched corner 36 and the length of the slot 38 is dimensioned to provide that when the wall 34 is pressed into the slot 38, the notched corner 36 retainingly engages the slot in the top wall of tube 12.

FIG. 5B is a sectional view showing the wall of FIG. 5A to better advantage with two notches 36A and 36B. When notches 36A engage the slot in tube 12, the wall is positioned in the region 13 thereby maintaining separation of the devices (devices not shown in FIGS. 5 A and B). When notches 36B engage the slot in the top wall of tube 12 as shown in FIG. 5B, the separator walls 34 are withdrawn from the region 13 allowing the devices to slide out of the tube 12.

In another variation of FIGS. 5A and B, the strip 38 is sufficiently flexible that it can be rolled up as each wall is withdrawn from its respective slot thereby permitting removing devices from the tube one at a time or, alternatively, unloading the devices one at a time without disturbing the remaining devices in the tube.

FIG. 6 shows the separator 42 in a strip 38 as being a short stud that fits into round hole 44 rather than the wall 20 shown in other figs.

FIG. 7 shows that the strip 38 may engage the top of the tube 12 by a stud 44 at each end of the tube. Each stud 44 has a flared end 46 and a notched neck 48 such that the stud 44 may be partially withdrawn from the flared hole 50 in the top of the tube 12 permitting the devices 16 to slide out of the tube as shown in FIG. 8. Or the studs 44 may be pressed all the way into the hole 50 to retain the devices as shown in FIG. 9.

In the foregoing paragraphs embodiments were described which achieve the objects of the invention. A major fearture is a tubular structure having a row of openings and a plurality of separators mounted on an elongated member such that each separator can be inserted into one of the holes respectively and all of the separators moved as a unit through the wall of the tube to one position where the devices are permitted to slide out of an open end of the tube or the separators can be moved to another position where each separator is positioned between neighboring devices in the tube thereby protecting the leads of the devices.

It will be unterstood that these principles of the invention can be applied to packaging a wide variety of devices such as integrated circuit packages, pieces of fruit, etc. It will be further understood that the cross sectional shape of the tube can be selected to accomodate the shape and size of the device. Thus, the tube may have a rectangular cross section as shown in the drawings, or it may be cylindrical, elliptical, etc.

The carrier of this invention may also configured to carry more than one row of devices. For example, FIG. 10 shows an arrangement where the carrier comprises a tubular means 12 having two tubular chambers 52, each having a rectangular cross section and slots 22. An elongated strip member 54 is shown having two walls shown in FIG. 10.

The shapes described lend themselves primarily to manufacturing by extrusion although certain secondary operations would be performed such as punching openings in the top surfaces of the tubes. The material of choice for transporting electronic circuits would be an extrudable plastic (PVC, Polypropylene, etc) although other materials such as metal or paper stock may be selected for other purposes. When the carriers are plastic intended to carry integrated circuits, the plastic should be antistatic.

The several embodiments presented illustrate that various constructions can be used which incorporate the principals of the invention. I therefore wish to define the scope of my invention by the appended claims and in view of the specification if need be.

I claim:

1. A carrier for transporting devices while maintaining each device out of contact with any other device which comprises:

a tube means adapted for retaining said devices and having an elongated tube wall extending in a direction mid at least one open end in said robe means;

said tube wall having a plurality of openings, said plurality of openings arranged in a row in said tube wall extending in said direction;

a plurality of separators adapted for maintaining said devices out of contact with one another;

a means for supporting said plurality of separators, arranged in operable combination with said tube and said plurality of separators to permit inserting each separator through one of said openings respectively thereby defining a plurality of regions inside said tube wherein a device may be located in each said region out of contact with any other of said devices and permitting withdrawal of said plurality of separators from inside said tube by withdrawing said means for supporting said plurality of separators such as to permit said devices to slide out of said at least one open end.

2. A carrier as in claim 1 wherein said tube has a circular cross section.

3. A carrier as in claim 1 wherein said tube has a rectangular cross section.

4. A carrier as in claim 1 wherein each said separator is a wall oriented to have a long dimension perpendicular to a long dimension of said means for supporting said plurality of separators.

5. A carrier as in claim 1 which comprises means for detachably engaging said means for supporting said plurality of separators in one position where each said separator prevents contact between each device and any neighboring device located in said regions and another position wherein each said separator is withdrawn from said regions permitting said devices to slide out of said open end of said tube means.

6. A carrier as in claim 4 which comprises means for detachably engaging said means for supporting said plurality of separators in one position where each said wall prevents contact between an adjacent device and any neighboring device located in said regions and another position wherein each said wall is withdrawn from said respective region permitting said adjacent device to slide out of said open end of said tube means.

7. A carrier means as in claim 6 wherein said said means for supporting said plurality of separators is a pair of notches in an edge of at least one of said walls.

8. A carrier as in claim 5 wherein said means for detachably engaging is at least one stud having one end attached to said means for supporting said plurality of separators and a flared second end providing that said at least one stud inserted into one of said openings be enabled to engage edges of said one of said openings thereby resisting complete separation of said means for supporting said plurality of separators from said tube.

9. A carrier as in claim 5 wherein:
said means is an elongated channel having two side members joined by said means for supporting said plurality of separators and each said side member has an elongated ridge facing said other side member;
said tube having opposite outside surfaces and two pairs of grooves, one pair of grooves in one of said outside surfaces and said other pair of grooves in said other outside surface respectively;
said channel straddling said tube and arranged in operable combination with said tube with said ridge releasably engaging one groove respectively when it is required to maintain separation of said devices and said other groove when it is required to remove said devices from said tube.

10. A carrier as in claim 1 wherein said means for supporting said plurality of separators is a strip.

11. A carrier as in claim 10 wherein said strip is flexible.

12. A carrier as in claim 10 wherein each said separator is a stud.

13. A carrier as in claim 1 wherein said carrier is made from a plastic.

14. A carrier as in claim 13 wherein said plastic is antistatic.

15. A carrier as in claim 1 wherein said tube has a plurality of tube chambers.

* * * * *